United States Patent [19]

Nagashima et al.

[11] 4,336,319
[45] Jun. 22, 1982

[54] LIGHT-SOLUBILIZABLE COMPOSITION

[75] Inventors: Akira Nagashima; Nobuyuki Kita, both of Shizuoka, Japan

[73] Assignee: Fuji Photo Film Co., Ltd., Kanagawa, Japan

[21] Appl. No.: 199,123

[22] Filed: Oct. 22, 1980

[30] Foreign Application Priority Data

Oct. 23, 1979 [JP] Japan ................... 54-136728

[51] Int. Cl.$^3$ ........................ G03C 1/60; G03F 7/08; G03C 1/94
[52] U.S. Cl. ..................... 430/165; 430/190; 430/191; 430/192; 430/302; 430/950; 430/961
[58] Field of Search ............... 430/165, 191, 192, 157, 430/159, 270, 950, 961, 144, 196, 302, 190

[56] References Cited

U.S. PATENT DOCUMENTS

| | | | |
|---|---|---|---|
| 3,010,390 | 11/1961 | Buskes | 430/302 |
| 3,148,064 | 9/1964 | Rauner et al. | 430/196 |
| 3,891,443 | 6/1975 | Halpern et al. | 430/259 |
| 4,100,321 | 7/1978 | Schlesinger | 430/144 |
| 4,115,128 | 9/1978 | Kita | 430/191 |
| 4,168,979 | 9/1979 | Okishi et al. | 430/950 |
| 4,252,879 | 2/1981 | Inoue et al. | 430/165 |

OTHER PUBLICATIONS

Research Disclosure, #18056, Apr. 1979, pp. 160–161.

Primary Examiner—Charles L. Bowers, Jr.
Attorney, Agent, or Firm—Sughrue, Mion, Zinn, Macpeak and Seas

[57] ABSTRACT

A light-solubilizable composition comprising at least one o-quinonediazide compound and at least one alkali-soluble resin compatible therewith as essential components and containing fine particles dispersed therein which:

(1) have an average particle size of 500 m$\mu$ or less;
(2) are insoluble in an organic solvent used to coat the light-solubilizable composition and have a hydrophobic surface;
(3) are transparent or white; and
(4) have a refractive index of 1.3 to 1.7, in an amount of 0.1 to 50% by weight based on said light-solubilizable composition.

9 Claims, No Drawings

LIGHT-SOLUBILIZABLE COMPOSITION

BACKGROUND OF THE INVENTION

1. Field of the Invention

The present invention relates to a light-solubilizable composition suitable for producing lithographic printing plates, IC circuits and photo-masks.

In greater detail, it relates to a light-solubilizable composition comprising an o-quinonediazide compound, an alkali-soluble resin and insoluble fine particles having a hydrophobic surface.

2. Description of the Prior Art

Hitherto, light-solubilizable compositions comprising o-quinonediazide compounds and alkali-soluble resins have been used for the production of lithographic printing plates or as photo-resists because of their excellent properties. However, these light-solubilizable compositions have the drawback of insufficient physical strength in the case of forming a coating films, particularly, if scratches are found on the coating films they are magnified by the development, or the drawback that the amount of composition processable with a prescribed amount of a developing solution (development processing ability) is insufficient; consequently, a large amount of developing solution is required.

Further, coating films formed using these light-solubilizable compositions must be developed under exacting conditions (low development tolerance), i.e., precise control of alkali concentration in the developing solution, temperature of the developing solution and developing time are required, which is very difficult.

To overcome these drawbacks, various attempts have been made. For example, in Japanese patent application (OPI) No. 8128/78 (the term "OPI" as used herein refers to a "published unexamined Japanese patent application"), it is proposed to use fillers such as talc powder, glass powder, clay, starch, wheat powder, corn powder or Teflon powder, etc., in order to improve the strength of a coating film. However, these conventional fillers do not extend development tolerance and most of them have the drawback that printing inks adhere to image areas in the case of use as a lithographic printing plate only with difficulty.

Further, when the ratio of o-quinonediazide compound(s) in the light-solubilizable composition is increased, though the development tolerance is widened and development processing ability is improved, sensitivity deteriorates.

On the other hand, as described in U.S. Pat. No. 4,115,128, if cyclic acid anhydrides are added to such light-solubilizable compositions, sensitivity is improved without changing development tolerance and development tolerance is improved without changing sensitivity by increasing the amount of o-quinonediazide compounds. However, such a technique has the drawback that when the amount of o-quinonediazide compounds is increased to provide sufficient development tolerance, the amount of cyclic acid anhydrides must be greatly increased in order to prevent a deterioration of sensitivity, whereby the physical strength of a coating film deteriorates.

Further, it is known from U.S. Pat. No. 4,115,128 to add pigments to light-solubilizable compositions comprising quinonediazide compounds and alkali-soluble resins to provide colored images. Although the addition of pigments improves image coloring, such technique has the drawback that when the amount of pigment is increased to improve coating film physical strength, sensitivity remarkably deteriorates or printing-out images are difficult to see when using a photosensitive lithographic printing plate having light-fading printing-out capability (capability that visible images are obtained after exposure without developing) because of the color of the pigment(s).

SUMMARY OF THE INVENTION

A chief object of the present invention is to provide a light-solubilizable composition which yields coating films of high physical strength.

Another object of the present invention is to provide a light-solubilizable composition of high sensitivity, high development processing ability and wide development tolerance.

A further object of the present invention is to provide a light-solubilizable composition capable of producing lithographic printing plates having image areas with an excellent oleophilic property.

Another object of the present invention is to provide a light-solubilizable composition with light-fading printing-out property.

As a result of various studies, we have found that the above-described objects can be attained by adding fine particles which: (1) have an average particle size of 500 m$\mu$ or less; (2) are insoluble and have a hydrophobic surface; (3) are transparent or white; and (4) have a refractive index of 1.3 to 1.7, to a light-solubilizable composition comprising one or more o-quinonediazide compounds and one or more alkali-soluble resins as essential components in an amount of 0.1 to 50% by weight based on the total solid weight of the light-solubilizable composition.

DETAILED DESCRIPTION OF THE INVENTION

The o-quinonediazide compounds used in the present invention are compounds having at least one o-quinonediazide group, the solubility of which varies upon exposure to active light rays to which the o-quinonediazide compound is active.

Such o-quinonediazide compounds are described in *Light-Sensitive Systems* written by J. Kosar (John Wiley & Sons. Inc.) pp. 339–352, and such compounds useful in the present invention can be selected therefrom.

Particularly preferred o-quinonediazide compounds are o-naphthoquinonediazide compounds, as are described in, for example, U.S. Pat. Nos. 2,766,118, 2,767,092, 2,772,972, 2,859,112, 2,907,665, 3,046,110, 3,046,111, 3,046,115, 3,046,118, 3,046,119, 3,046,120, 3,046,121, 3,046,122, 3,046,123, 3,061,430, 3,102,809, 3,106,465, 3,635,709 and 3,674,443. Among them, o-naphthoquinonediazide sulfonic acid esters of aromatic hydroxy compounds, o-naphthoquinonediazide carboxylic acid esters of aromatic hydroxy compounds, o-naphthoquinonediazide sulfonic acid amides of aromatic amino compounds and o-naphthoquinonediazide carboxylic acid amides of aromatic amino compounds are preferred. Particularly, products produced by esterification of o-naphthoquinonediazide sulfonic acid with a pyrogallolacetone condensate as described in U.S. Pat. No. 3,635,709, products produced by esterification of o-naphthoquinonediazide sulfonic acid or o-naphthoquinonediazide carboxylic acid with a polyester having a terminal hydroxy group as described in U.S. Pat. No. 4,028,111, and products produced by esterification of o-naphthoquinonediazide sulfonic acid or o-naphthoquinonediazide carboxylic acid with a homopolymer of p-hydroxystyrene or a copolymer thereof with other copolymerizable monomers as described in U.S. Pat. No. 4,139,384 are especially excellent.

Preferred alkali-soluble resins used in the present invention are those which are soluble in an aqueous alkaline solution having a pH of 11 or more, preferably 12 or more and include novolak resins. Examples thereof include phenol-formaldehyde resins, cresol-formaldehyde resins, p-tert-butylphenol-formaldehyde resins, phenol modified xylene resins, i.e., a formaldehyde condensate of phenol and xylene, and phenol modified xylene mesitylene resins, i.e., a formaldehyde condensate of phenol, xylene and mesitylene. Other useful alkali-soluble resins include polyhydroxystyrene, polyhalogenated hydroxystyrene, and copolymers of acrylic acid or methacrylic acid and other vinyl compounds (for example, methyl methacrylate), etc.

The amount of o-quinonediazide compounds in the light-solubilizable composition comprising the o-quinonediazide compounds and alkali-soluble resins is 10 to 50% by weight, preferably 20 to 40% by weight, based on the total solid weight. The amount of the alkali-soluble resins added is 90 to 50% by weight, preferably 80 to 60% by weight, based on the total solid weight.

The fine particles used in the present invention have an average particle size of 500 m$\mu$ or less, are transparent or white, have a refractive index of 1.3 to 1.7, are insoluble and have a hydrophobic surface. Examples of typical fine particles having such properties include aerosols of silicon dioxide where hydrophilic silanol groups on the surface thereof have processed to render the same hydrophobic, and are also commercially available. Examples thereof include silicon dioxides produced by reacting hydrophilic silanol groups on the surface thereof with a reactive silane coupling agent such as a trialkylchlorosilane having 1 to 4 carbon atoms, a dialkyldichlorosilane having 1 to 4 carbon atoms, vinyltrichlorosilane, vinyltriethoxysilane, vinyl tris($\beta$-methoxyethoxy)silane, $\beta$-(3,4-epoxycyclohexyl)ethyltrimethoxysilane, $\gamma$-glycidoxypropyltrimethoxysilane, $\gamma$-methacryloxypropyltrimethoxysilane, N-$\beta$-(aminoethyl)-$\gamma$-aminopropylmethyldimethoxysilane or N-$\beta$-(aminoethyl)-$\gamma$-aminopropyltrimethoxysilane, etc., and silicon dioxides produced by reacting the hydrophilic silanol groups with a titanium alkyl oxide having 1 to 5 carbon atoms, chromic acid methacrylate, isocyanate compounds such as toluenediisocyanate or phenylisocyanate, etc., aliphatic acids having 4 to 26 carbon atoms or rosins, etc.

In addition to silicon dioxides, other useful inorganic fine particles include kaolin, bentonite, talc, attapulgite, silicates such as aluminium silicate or calcium silicate, etc., calcium carbonate and aluminium hydroxide, etc., which are obtained by reacting hydrophilic groups on the surface thereof with the above-described silane coupling agents, a titanium alkyl oxide having 1 to 5 carbon atoms, chromic acid methacrylate, isocyanate compounds such as toluenediisocyanate or phenylisocyanate, etc., aliphatic acids having 4 to 26 carbon atoms or rosins, etc., to provide the same with a hydrophobic surface.

Further, finely divided silica powders obtained by hydrolyzing alkyl silicates having 1 to 4 carbon atoms and finely divided organic powders which are insoluble in coating solvents, such as three dimensionally cross-linked phenol resins, three dimensionally cross-linked styrenevinyl toluene copolymers, alcohol-insoluble polyamides, alcohol-insoluble polyacrylonitriles and alcohol-insoluble acrylonitrile copolymers, etc.

Fine particles having a hydrophobic property as are used in the present invention mean those which absorb moisture in an amount of 2.0 mg or less per 100 $m^2$ of surface area in air at 60% of the relative humidity and 20° C.

Further, the fine powders insoluble in solvents for coating mean those which are insoluble in solvents which dissolve o-quinonediazide compounds and alkali-soluble resins, for example, ethylene dichloride, cyclohexanone, methyl ethyl ketone, ethylene glycol monomethyl ether, ethylene glycol monoethyl ether, methyl cellosolve acetate, toluene and ethyl acetate.

The fine particles used in the present invention are obtained by processing to be hydrophobic. If hydrophilic fine particles not processed to be hydrophobic are used in forming a lithographic printing plate, the drawback is encountered that the oleophilic property of image areas deteriorates, whereby printing inks adhere only with difficulty to image areas.

Further, the fine particles preferably have excellent light-permeability (transparency) so as to not deteriorate the light sensitivity of light-solubilizable composition; also, the refractive index of the fine particles is in the range of 1.3 to 1.7, and it is preferred that the refractive index be nearly equal to that of a mixture of o-quinonediazide compounds and alkali-soluble resins. If the refractive index is more than or less than the above range, the sensitivity of the light-solubilizable composition deteriorates because of increased light loss.

The average particle size (diameter) of the fine particles is 500 m$\mu$ or less, preferably 100 m$\mu$ or less and, particularly, 30 m$\mu$ or less. The smaller the particle size, the easier the particles are stably dispersed in a photosensitive solution comprising the o-quinonediazide compounds and alkali-soluble resins and, in addition, development tolerance and development processing ability are improved. In the case that the average particle size is greater than 500 m$\mu$, the effects of the present invention are hardly observed.

The fine particles used in the present invention should be transparent or white. If the fine particles are colored, not only are printing-out images difficult to see (because of the color of said fine particles) even if a conventional light-fading printing-out agent is added to the light-solubilizable composition, but sensitivity also deteriorates.

The amount of the fine particles added in the present invention is 0.1 to 50% by weight, preferably 1 to 20% by weight, based on the total weight of the light-solubilizable composition. If it is less than 0.1% by weight, the effects of the fine particles are hardly observed. If it is more than 50% by weight, the sensitivity causes deterioration.

It is possible to add cyclic acid anhydrides to the composition of the present invention in order to increase sensitivity, to add printing-out agents to obtain visible image immediately after exposure, to add dyes as image coloring agents or other fillers, etc.

Examples of used cyclic acid anhydrides include phthalic acid anhydride, tetrahydrophthalic acid anhydride, hexahydrophthalic acid anhydride, 3,6-endooxy-$\Delta^4$-tetrahydrophthalic acid anhydride, tetrachlorophthalic acid anhydride, maleic acid anhydride, chloromaleic acid anhydride, $\alpha$-phenylmaleic acid anhydride, succinic acid anhydride and pyromellitic acid, etc., as described in U.S. Pat. No. 4,115,128. By adding these cyclic acid anhydrides in an amount of 1 to 15% by weight based on the total composition, sensitivity can be increased to maximum three times or so.

Examples of printing-out agents for obtaining visible images immediately after exposure include the combination of a photosensitive compound which releases an acid upon exposure to light and an organic dye capable of forming a salt, e.g., a combination of o-naphthoquinonediazide-4-sulfonic acid halogenide and a salt forming organic dye as described in Japanese patent application (OPI) Nos. 36209/75 and 8129/78 and a combination of trihalomethyl compound and a salt forming organic dye as described in Japanese patent application (OPI) Nos. 36223/78 and 74728/79.

As the image coloring agents, other dyes can be used in addition to the above-described salt forming organic dyes. Preferred dyes include salt forming organic dyes such as oil-soluble dyes and basic dyes, e.g., Oil Yellow #101, Oil Yellow #130, Oil Pink #312, Oil Green BG, Oil Blue BOS, Oil Blue #603, Oil Black BY, Oil Black BS and Oil Black T-505 (produced by Orient Chemical Industry Co.), Crystal Violet, Methyl Violet, Rhodamine B, Malachite Green and Methylene Blue.

The composition of the present invention is applied to a base after dissolution in a solvent capable of dissolving each of the above-described components other than the fine particles. Examples of the solvent used include ethylene dichloride, cyclohexanone, methyl ethyl ketone, ethylene glycol monomethyl ether, ethylene glycol monoethyl ether, 2-methoxyethyl acetate, toluene and ethyl acetate, etc., which may be used solely or as a mixture thereof. The concentration of the above-described components (solid content) is 2 to 50% by weight. Further, it is generally preferred that the amount applied is 0.5 to 3.0 $g/m^2$ as solid content. Though sensitivity increases as decreased amounts are applied, the properties of the photosensitive film deteriorate.

As bases for producing lithographic printing plate precursors using the light-solubilizable composition of the present invention, there are aluminum plates subjected to a hydrophilic treatment, for example, aluminum plates subjected to a silicate treatment, aluminum plates subjected to an anodic oxidation, aluminum plates subjected to a sanding treatment or aluminum plates subjected to electrodeposition with a silicate, etc., and zinc plates, stainless steel plates, chromium treated steel plates, plastic films subjected to a hydrophilic treatment and paper.

As a developing solution for the photosensitive composition of the present invention, it is preferred to use an aqueous solution of one or more inorganic alkali agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate or aqueous ammonia, etc., which are added to provide a 0.1 to 10% by weight concentration, preferably a 0.5 to 5% by weight concentration, of the alkali agent.

If necessary or desired, surface active agents or organic solvents such as an alcohol, etc., may be added to the above-described aqueous alkaline solution.

In the following, the present invention is illustrated in greater detail with reference to examples. All percentages in the following examples are by weight unless otherwise stated.

EXAMPLE 1

A 2S aluminum plate 0.15 mm thick was dewaxed by dipping in a 10% aqueous solution of sodium tertiary phosphate at 80° C. for 3 minutes. After sanding with a nylon brush, desmutting was carried out with a 3% aqueous solution of sodium hydrogen sulfate. The aluminum plate was then processed for 1 minute with a 1.5% aqueous solution of sodium silicate at 70° C. to produce aluminum plate (I).

The following photosensitive solution was applied to aluminum plate (I), and then dried at 100° C. for 2 minutes.

Prior to application of the photosensitive solution, Aerosil R-972 (trade name; hydrophobic silica powder produced by Nippon Aerosil Co.; aerosol of silicon dioxide wherein 70% or more of the hydroxy groups of the hydrophilic silanol groups on the surface thereof were replaced by hydrophobic methyl groups; 16 mμ average particle size; refractive index of 1.45; 0.9 mg moisture absorption amount per 100 $m^2$ of the surface area at 60% relative humidity and 20° C.) was dispersed therein in varying amounts by ultrasonic waves to form various samples using various samples of aluminum plate (I).

| Photosensitive Solution | |
|---|---|
| Esterified product of naphthoquinone-1,2-diazide-5-sulfonyl chloride and pyrogallol-acetone resin (formed per Example 1 of U.S. Pat. 3,635,709) | 0.9 g |
| Cresol-formaldehyde resin | 1.9 g |
| p-Nonylphenol-formaldehyde resin | 0.03 g |
| Aerosil R 972 (produced by Nippon Aerosil Co.) | amount defined in Table 1 |
| Tetrahydrophthalic acid anhydride | 0.2 g |
| 2-(p-Butoxyphenyl)-4,4-bis(trichloromethyl)-s-triazine | 0.02 g |
| Naphthoquinone-1,2-diazide-4-sulfonyl chloride | 0.02 g |
| Oil Blue #603 (produced by Orient Chemical Industry Co.) | 0.01 g |
| Crystal Violet | 0.01 g |
| Methyl ethyl ketone | 8 g |
| 2-Methoxyethyl acetate | 15 g |

The coating amount after drying was about 2.5 $g/m^2$.

Each of the photosensitive lithographic printing plates was exposed to light at a distance of 70 cm from a 30 amp carbon arc lamp and developed for 60 seconds at 25° C. in a 5.26% aqueous solution of sodium silicate having an $SiO_2/Na_2O$ molar ratio of 1.74 (pH 12.7), whereafter sensitivity was measured. The proper time in this case was regarded as the time by which 5 stages of a gray scale having a 0.15 density difference became completely white (time at which the photosensitive layer completely dissolved).

Development tolerance was represented by the development time required for that one stage of whitened stages in the gray scale having a 0.15 density difference underwent a change at 25° C. using the same developing solution.

Development processing ability was represented by the development processing amount when the number of whitened stages in the gray scale having a 0.15 density underwent a change of one stage at 25° C. using the same developing solution.

The physical strength of coating films was represented by the degree of scratching, after development with the same developing solution, observed on the photosensitive layer of the unexposed lithographic printing plate by scratching with a scratching tester. The following grades were encountered: scratches hardly observed represented by o; scratches observed represented by ×.

The degree of oleophilicity of image areas was represented by the number of sheets of paper fed until printing ink completely adhered to image areas from beginning of printing (the number of sheets of non-printed paper).

It can be understood from the results shown in Table 1 that development tolerance, development processing ability and physical strength of the coating films were improved by the addition of Aerosil R 972 without deteriorating sensitivity and oleophilicity. As comparative examples, results for the case of not using hydrophobic Aerosil R 972 and the case of using hydrophilic aerosil 130 having a 16 mμ average particle size (trade name for a hydrophilic silica powder produced by Nippon Aerosil Co.) are also set forth.

Further, in all examples shown in Table 1, distinct printing-out images were obtained after exposure to light.

TABLE I

| Amount of Oleophilic Aerosil R972 (g) | Proper Exposure Time (sensitivity) (second) | Development Tolerance (minute) | Development Processing Ability ($m^2/l$) | Physical Strength of Coating Film | Oleophilicity (number of nonprinted paper sheets) (sheet) |
| --- | --- | --- | --- | --- | --- |
| 0.05 | 100 | 3.5 | 3.5 | o | 5 |
| 0.2 | 100 | 4.0 | 4.5 | o | 5 |
| 0.5 | 100 | 5.0 | 5.0 | o | 5 |
| (Comparative Example) 0 | 100 | 3.0 | 3.0 | x | 5 |
| (Comparative Example) Hydrophilic Aerosil 130 0.2 | 100 | 4.0 | 4.5 | o-x | more than 200 sheets |

EXAMPLE 2

A 2S aluminum plate 0.24 mm thick was dewaxed by dipping in a 10% aqueous solution of sodium tertiary phosphate at 80° C. for 3 minutes. After sanding with a nylon brush, the plate was etched for about 10 seconds with sodium aluminate and desmutted with a 3% aqueous solution of sodium hydrogen sulfate. The resulting aluminum plate was subjected to anodic oxidation for 2 minutes in 20% sulfuric acid at a current density of 2 A/dm² to produce aluminum plate (II).

The following photosensitizing solution was applied to aluminum plate (II) and dried for 2 minutes at 100° C.

| Photosensitive Solution | |
| --- | --- |
| Esterified product of naphthoquinone-1,2-diazide-5-sulfonyl chloride and cresol-formaldehyde resin | 0.90 g |
| Cresol-formaldehyde resin | 1.98 g |
| Tetrahydrophthalic acid anhydride | 0.15 g |
| Crystal Violet | 0.015 g |
| Oil Blue 603 (produced by Orient Chemical Industry Co.) | 0.01 g |
| Naphthoquinone-1,2-diazide-4-sulfuony chloride | 0.02 g |
| Silica D-17 (trade name; silica produced by a wet process which was processed to render hydrophobic; average particle size: 20 mμ) | 2.0 g |
| 2-Methoxyethyl acetate | 20 g |
| Methyl ethyl ketone | 20 g |

The amount of coating after drying was 2.5 g/m².

This photosensitive lithographic printing plate was compared with an otherwise identical plate free of Silica D-17 in the same manner as in Example 1. As a result, it was found that by addition of Silica D-17 development tolerance improved from 3 minutes to 4 minutes, development processing ability improved from 3 m²/l to 4 m²/l, and the physical strength of the coating film was improved.

On the other hand, sensitivity and oleophilicity did not change. Further, distinct printing-out images were obtained in both cases after exposure to light.

While the invention has been described in detail and with reference to specific embodiments thereof, it will be apparent to one skilled in the art that various changes and modifications can be made therein without departing from the spirit and scope thereof.

What is claimed is:

1. A light-solubilizable composition comprising at least one o-quinonediazide compound and at least one alkali-soluble resin compatible therewith as essential components and containing fine particles dispersed therein which:
   (1) have an average particle size of 500 mμ or less;
   (2) are insoluble in an organic solvent used to coat the light-solubilizable composition and have a hydrophobic surface;
   (3) are transparent or white; and
   (4) have a refractive index of 1.3 to 1.7, in an amount of 0.1 to 50% by weight based on said light-solubilizable composition, wherein said fine particles are aerosols of silicon dioxide where hydrophilic silanol groups on the surface thereof have been processed to render the same hydrophobic.

2. A lithographic printing plate precursor comprising an aluminum support having provided thereon a layer of light-solubilizable composition as claimed in claim 1.

3. The lithographic printing plate precursor of claim 2, wherein said o-quinonediazide compound is a compound selected from the group consisting of o-naphthoquinonediazide sulfonic acid esters of aromatic hydroxy compounds, o-naphthoquinonediazide carboxylic acid esters of aromatic hydroxy compounds, o-naphthoquinonediazide sulfonic acid amides of aromatic amino compounds and o-naphthoquinonediazide carboxylic acid amides of aromatic amino compounds.

4. The lithographic printing plate precursor of claim 3, wherein said alkali-soluble resin is selected from the group consisting of a phenol-formaldehyde resin, a cresol-formaldehyde resin, a p-tert-butylphenol-formaldehyde resin, a phenol modified xylene resin and a phenol modified xylene mesitylene resin.

5. A light-solubilizable composition of claim 1, wherein the hydrophilic silanol groups on the surface of said silicon dioxide are reacted with a reactive silane coupling agent selected from the group consisting of a trialkylchlorosilane having 1 to 4 carbon atoms in the alkyl moiety thereof, a dialkyldichlorosilane having 1 to 4 carbon atoms in the alkyl moiety thereof, vinyltrichlorosilane, vinyltriethoxysilane, vinyltris($\beta$-methoxyethoxy)silane, $\beta$-(3,4-epoxycyclohexyl)ethyltrimethoxysilane, $\alpha$-glycidoxypropyltrimethoxysilane, $\alpha$-methacryloxypropyltrimethoxysilane, N-$\beta$-(aminoethyl)-$\alpha$-aminopropyltrimethoxysilane, a titanium alkyl oxide having 1 to 5 carbon atoms in the alkyl moiety thereof, chromic acid methacrylate, toluene diisocyanate, phenyl isocyanate, an aliphatic acid having 4 to 26 carbon atoms and a rosin.

6. The lithographic printing plate precursor of claim 4, wherein said fine particles have an average particle size of 100 m$\mu$ or less.

7. The lithographic printing plate precursor of claim 4, wherein said fine particles have an average particle size of 30 m$\mu$ or less.

8. The lithographic printing plate precursor of claim 4, wherein the amount of said fine particles is 1 to 20% by weight based on the total weight of said light-solubilizable composition.

9. The lithographic printing plate precursor of claim 4, wherein the amount of o-quinonediazide compound is 10 to 50% by weight based on the total solid weight of the light-solubilizable composition.

* * * * *